US010264676B2

(12) United States Patent
Yazaki et al.

(10) Patent No.: US 10,264,676 B2
(45) Date of Patent: Apr. 16, 2019

(54) PASSIVE ELEMENT ARRAY AND PRINTED WIRING BOARD

(71) Applicant: Murata Manufacturing Co., Ltd., Nagaokakyo-shi, Kyoto-fu (JP)

(72) Inventors: Hirokazu Yazaki, Nagaokakyo (JP); Keito Yonemori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/128,573

(22) Filed: Sep. 12, 2018

(65) Prior Publication Data
US 2019/0014665 A1    Jan. 10, 2019

Related U.S. Application Data

(63) Continuation of application No. PCT/JP2017/014872, filed on Apr. 11, 2017.

(30) Foreign Application Priority Data

Apr. 14, 2016    (JP) ................... 2016-081477
May 6, 2016    (JP) ................... 2016-093485

(51) Int. Cl.
*H05K 1/16*    (2006.01)
*H05K 1/11*    (2006.01)
(Continued)

(52) U.S. Cl.
CPC .......... *H05K 1/165* (2013.01); *H01F 27/2804* (2013.01); *H05K 1/11* (2013.01);
(Continued)

(58) Field of Classification Search
CPC .......... H05K 1/165; H05K 1/11; H05K 1/181; H01F 27/2804; H01F 2027/2809
See application file for complete search history.

(56) References Cited

U.S. PATENT DOCUMENTS 9,655,247 B1 *    5/2017    Yoon .................. H05K 1/181
2017/0179913 A1 *    6/2017    Song .................. H01F 27/245
(Continued)

FOREIGN PATENT DOCUMENTS

JP    06-302436 A    10/1994
JP    08-250333 A    9/1996
(Continued)

OTHER PUBLICATIONS

Official Communication issued in International Patent Application No. PCT/JP2017/014872, dated Jul. 4, 2017.

*Primary Examiner* — Hoa C Nguyen
*Assistant Examiner* — Amol H Patel
(74) *Attorney, Agent, or Firm* — Keating & Bennett, LLP

(57) ABSTRACT

A passive element array includes an element body including laminated base material layers, first and second passive elements arranged in the element body perpendicular or substantially perpendicular to a lamination direction of the plurality of base material layers, a pair of first input/output terminals provided at one main surface of the element body and connected to the first passive element and a pair of second input/output terminals provided at the other main surface of the element body and connected to the second passive element.

20 Claims, 10 Drawing Sheets

(51) Int. Cl.
*H05K 1/18* (2006.01)
*H01F 27/28* (2006.01)

(52) U.S. Cl.
CPC ...... *H01F 2027/2809* (2013.01); *H05K 1/181* (2013.01); *H05K 2201/1006* (2013.01)

(56) References Cited

U.S. PATENT DOCUMENTS

2017/0287622 A1* 10/2017 Ishizaki ................ H01F 27/323
2017/0316867 A1* 11/2017 Kamijima ........... H01F 27/2804

FOREIGN PATENT DOCUMENTS

| JP | 11-224817 A | 8/1999 |
| JP | 2007-066973 A | 3/2007 |
| JP | 2012-019443 A | 1/2012 |

* cited by examiner

PASSIVE ELEMENT ARRAY AND PRINTED WIRING BOARD

CROSS REFERENCE TO RELATED APPLICATIONS

This application claims the benefit of priority to Japanese Patent Application No. 2016-081477 filed on Apr. 14, 2016 and Japanese Patent Application No. 2016-093485 filed on May 6, 2016, and is a Continuation Application of PCT Application No. PCT/JP2017/014872 filed on Apr. 11, 2017. The entire contents of each of these applications are hereby incorporated herein by reference.

BACKGROUND OF THE INVENTION

1. Field of the Invention

The present invention relates to a passive element array including a plurality of passive elements and a printed wiring board in which the passive element array is included.

2. Description of the Related Art

Conventionally, passive element arrays of a chip type in which a plurality of passive elements are provided inside an element body that includes a plurality of laminated base material layers have been known.

As an example of passive element arrays of this type, a passive element array that includes three coil elements (passive elements) and three pairs of input/output terminals corresponding to the three coil elements is disclosed in Japanese Unexamined Patent Application Publication No. 8-250333. In the passive element array described in Japanese Unexamined Patent Application Publication No. 8-250333, the coil elements have different winding axes (coil axes), so that isolation between the coil elements is able to be ensured.

Furthermore, a passive element array that includes four coil elements and four pairs of input/output terminals corresponding to the four coil elements is disclosed in Japanese Unexamined Patent Application Publication No. 11-224817. In the passive element array described in Japanese Unexamined Patent Application Publication No. 11-224817, a magnetic shielding layer is provided between adjacent coil elements, so that isolation between the coil elements is able to be ensured.

However, with the passive element arrays described in Japanese Unexamined Patent Application Publication No. 8-250333 and Japanese Unexamined Patent Application Publication No. 11-224817, it is difficult to ensure isolation between input/output terminals for adjacent coil elements although isolation between coil elements is able to be ensured.

SUMMARY OF THE INVENTION

Preferred embodiments of the present invention provide passive element arrays that are able to ensure isolation between input/output terminals of each passive element.

A passive element array according to a preferred embodiment of the present invention that is provided in a printed wiring board, includes an element body that includes a plurality of laminated base material layers; a first passive element and a second passive element that are provided in the element body and arranged in a direction perpendicular or substantially perpendicular to a lamination direction of the plurality of base material layers; a pair of first input/output terminals that are provided at one main surface of the element body and connected to the first passive element; and a pair of second input/output terminals that are provided at another main surface of the element body and connected to the second passive element.

With this configuration, the first input/output terminals connected to the first passive element and the second input/output terminals connected the second passive element are provided at different main surfaces of the element body with the element body interposed therebetween. Therefore, isolation between the first input/output terminals and the second input/output terminals is able to be ensured.

Furthermore, the passive element array may further include a third passive element that is provided in the element body and arranged in a direction perpendicular or substantially perpendicular to the lamination direction, with respect to the first passive element; a pair of third input/output terminals that are provided at the one main surface of the element body and connected to the third passive element; and a ground terminal that is provided at the one main surface of the element body. The ground terminal may be provided between the pair of first input/output terminals and the pair of third input/output terminals.

With this configuration, the ground terminal is provided between the first input/output terminals and the third input/output terminals. Therefore, isolation between the first input/output terminals and the third input/output terminals is able be ensured. Furthermore, the second input/output terminals and the third input/output terminals are provided at different main surfaces of the element body with the element body interposed therebetween. Therefore, isolation between the second input/output terminals and the third input/output terminals is able to be ensured.

Furthermore, the third passive element may be provided opposite the first passive element relative to the second passive element, along a direction in which the first passive element and the second passive element are arranged.

With this configuration, the first passive element, the second passive element, and the third passive element are arranged in order. Therefore, isolation between input/output terminals is able to be ensured while a passive element array with a simple structure is achieved.

Furthermore, when the element body is viewed from the lamination direction, the pair of first input/output terminals may be provided at a position overlapping the first passive element, the pair of second input/output terminals may be provided at a position overlapping the second passive element, the pair of third input/output terminals may be provided at a position overlapping the third passive element, and the ground terminal may be provided at a position overlapping the second passive element.

With this configuration, isolation between input/output terminals is able to be ensured while a reduction in the size of a passive element array is achieved.

Furthermore, the ground terminal may be a second ground terminal. The passive element array may further include a first ground terminal and a third ground terminal that are provided at the other main surface of the element body. When the element body is viewed from the lamination direction, the first ground terminal may be provided at a position overlapping the first passive element, and the third ground terminal may be provided at a position overlapping the third passive element.

With this configuration, a structure in which ground terminals are arranged at both ends of the second input/output terminal is obtained. Therefore, for example, in the case in which the passive element array is included in a printed wiring board, a situation in which an input/output signal to the second input/output terminal interferes with another signal is able to be reduced or prevented. Furthermore, a structure in which ground terminals are provided at the other main surface so as to face the first input/output terminal and the third input/output terminal provided at the one main surface of the element body is obtained.

Therefore, uneven distribution of terminals provided at the one main surface and the other main surface is reduced, and deflection and distortion of the element body which may occur in the manufacturing process of the element body is able to be reduced or prevented.

Furthermore, the first passive element and the second passive element may be provided at different positions in the lamination direction.

With this configuration, isolation between the first passive element and the second passive element is able to be ensured.

Furthermore, the first passive element may be provided at a position closer to the one main surface than the other main surface, and the second passive element may be provided at a position closer to the other main surface than the one main surface.

With this configuration, signal interference between the first passive element and the second passive element is able to be ensured.

Furthermore, each of the first passive element, the second passive element, and the third passive element may be an inductor.

With this configuration, isolation between the first input/output terminal connected to the first passive element, which is an inductor, and the second input/output terminal connected to the second passive element, which is an inductor, is able to be ensured. Accordingly, electrical characteristics of each the inductors are able to be stabilized.

Furthermore, the passive element array may further include a first facing electrode that faces the first ground terminal, a second facing electrode that faces the second ground terminal, and a third facing electrode that faces the third ground terminal, the first facing electrode, the second facing electrode, and the third facing electrode being provided in the element body. The first facing electrode may be connected to one end or the other end of the first passive element. The second facing electrode may be connected to one end or the other end of the second passive element. The third facing electrode may be connected to one end or the other end of the third passive element.

With this configuration, the first ground terminal and the first facing electrode, the second ground terminal and the second facing electrode, and the third ground terminal and the third facing electrode define three capacitors. Furthermore, each of the first passive element, the second passive element, and the third passive element is an inductor. Therefore, the passive element array that includes three LC filters is provided.

Furthermore, a passive element array according to a preferred embodiment of the present invention that is mounted in a printed wiring board, includes an element body that includes a plurality of laminated base material layers, a first passive element and a second passive element that are provided in the element body and arranged in a direction perpendicular or substantially perpendicular to a lamination direction of the plurality of base material layers; a pair of first input/output terminals that are provided at one main surface of the element body and connected to the first passive element; and a pair of second input/output terminals that are provided at the other main surface of the element body and connected to the second passive element. The first input/output terminals are connected to a flexible wiring board or a flexible cable, and the second input/output terminals are connected to the printed wiring board.

With this configuration, the flexible wiring board or the flexible cable connected to the first input/output terminals and the printed wiring board connected to the second input/output terminals may be arranged with the element body of the passive element array interposed therebetween. With the passive element array, isolation between the flexible wiring board or the flexible cable and the printed wiring board is able to be ensured.

Furthermore, a printed wiring board according to a preferred embodiment of the present invention includes a passive element array provided therein, the passive element array including an element body that includes a plurality of laminated base material layers; a first passive element and a second passive element that are provided in the element body and arranged in a direction perpendicular or substantially perpendicular to a lamination direction of the plurality of base material layers; a pair of first input/output terminals that are provided at one main surface of the element body and connected to the first passive element; and a pair of second input/output terminals that are provided at the other main surface of the element body and connected to the second passive element.

With this configuration, a printed wiring board in which a passive element array with isolation between input/output terminals being ensured is built, is able to be provided.

Furthermore, a printed wiring board according to a preferred embodiment of the present invention includes a passive element array mounted therein, the passive element array including an element body that includes a plurality of laminated base material layers; a first passive element and a second passive element that are provided in the element body and arranged in a direction perpendicular or substantially perpendicular to a lamination direction of the plurality of base material layers; a pair of first input/output terminals that are provided at one main surface of the element body and connected to the first passive element; and a pair of second input/output terminals that are provided at the other main surface of the element body and connected to the second passive element. The first input/output terminals are connected to a flexible wiring board or a flexible cable, and the second input/output terminals are connected to the printed wiring board.

With this configuration, the flexible wiring board or the flexible cable connected to the first input/output terminals and the printed wiring board connected to the second input/output terminals may be arranged with the element body of the passive element array interposed therebetween. With the use of the printed wiring board in which the passive element array is mounted, isolation between the flexible wiring board or the flexible cable and the printed wiring board is able to be ensured.

According to preferred embodiments of the present invention, passive element arrays that are each able to ensure isolation between input/output terminals for passive elements are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
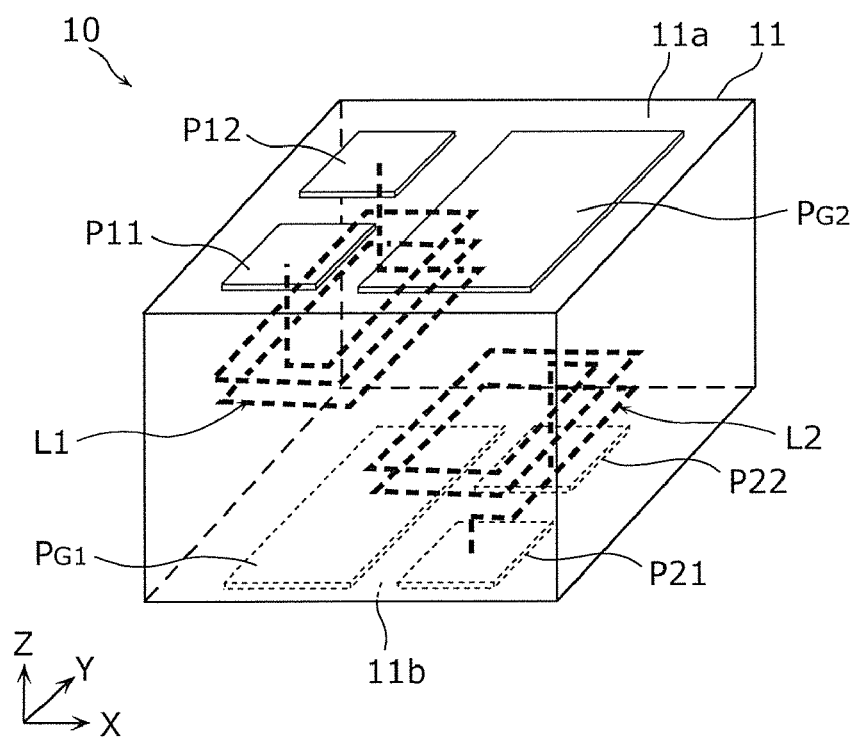
FIG. 1 is a schematic view of a passive element array according to a first preferred embodiment of the present invention.

Hereinafter, passive element arrays and printed wiring boards according to preferred embodiments of the present invention will be described with reference to drawings. The preferred embodiments described hereinafter each illustrate a preferred specific example of the present invention. Numerical values, shapes, materials, components, and arrangement and connection structures of the components, manufacturing steps, orders of manufacturing steps, and other parameters and features illustrated in the preferred embodiments described below are merely examples, and are not intended to limit the present invention. Components in the preferred embodiments described below, except those described in any one of the independent claims defining the highest concepts of the present invention, will be described as optional components. The sizes or ratios between the sizes of the components illustrated in the drawings are not strictly correct. Furthermore, in each of the drawings, for substantially the same configuration, the same reference signs will be provided, and redundant explanation will be omitted or simplified. In the preferred embodiments described below, "being connected" includes not only being directly connected but also being electrically connected with other elements interposed therebetween.

First Preferred Embodiment

A passive element array according to a first preferred embodiment of the present invention is a passive element array in a chip that is provided in a printed wiring board. Passive elements of the passive element array may be, for example, inductors, capacitors, resistors, and other suitable passive elements. In the preferred embodiments, inductors will be described as non-limiting examples of passive elements.

Figure 2A:
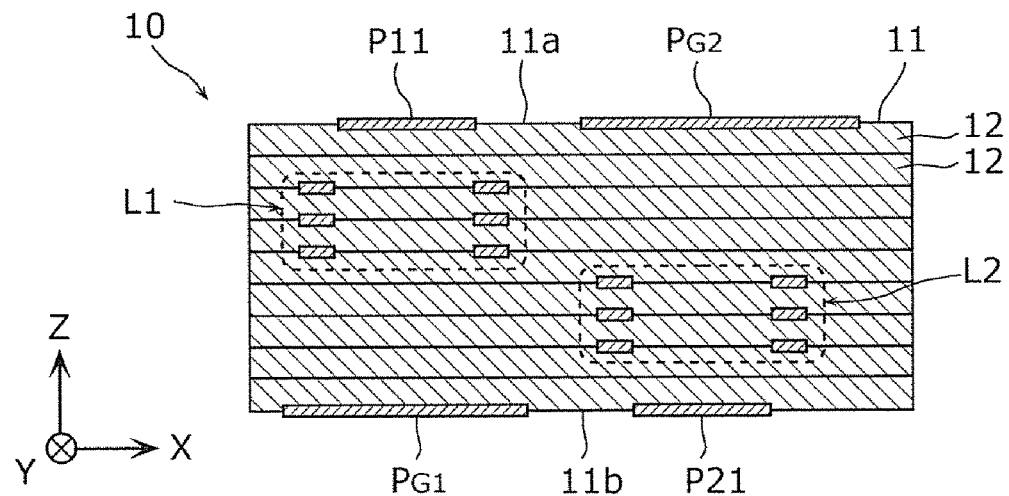
FIG. 2A is a cross-sectional schematic view of the passive element array according to the first preferred embodiment of the present invention when viewed from a Y direction.
Figure 2B:
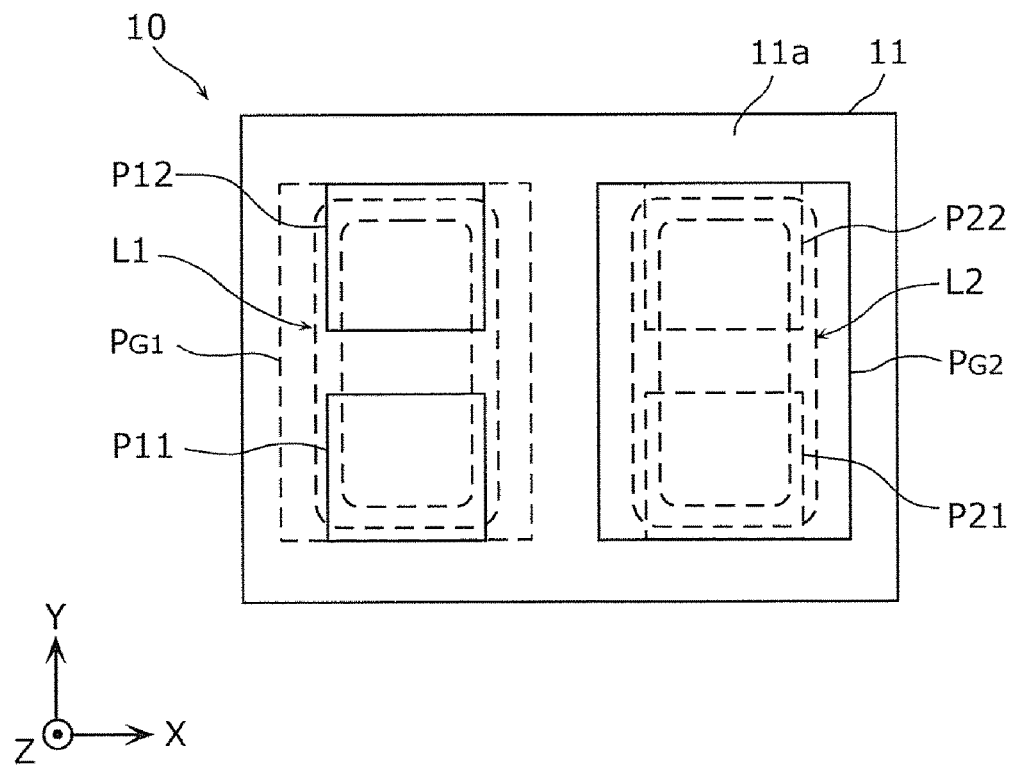
FIG. 2B is a diagram illustrating the passive element array according to the first preferred embodiment of the present invention when viewed from a lamination direction.
Figure 3:
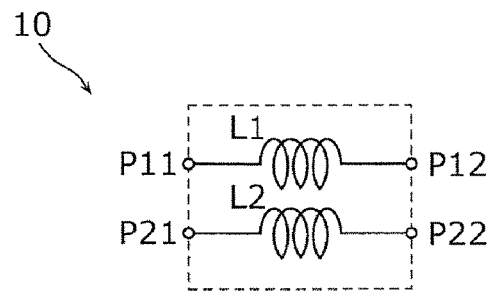
FIG. 3 is a diagram illustrating an equivalent circuit of the passive element array according to the first preferred embodiment of the present invention.

FIG. 1 is a schematic view of a passive element array 10 according to the first preferred embodiment. FIG. 2A is a cross-sectional schematic view of the passive element array 10 when viewed from a Y direction. FIG. 2B is a diagram illustrating the passive element array 10 when viewed from a lamination direction. FIG. 3 is a diagram illustrating an equivalent circuit of the passive element array 10.

The passive element array 10 includes, as illustrated in FIGS. 1, 2A, and 2B, an element body 11 that includes a plurality of laminated base material layers 12, a first passive element L1 and a second passive element L2 that are provided in the element body 11, a pair of first input/output terminals P11 and P12 that are connected to the first passive element L1, and a pair of second input/output terminals P21 and P22 that are connected to the second passive element L2. The passive element array 10 also includes a first ground terminal $P_{G1}$ that corresponds to the first passive element L1 and a second ground terminal $P_{G2}$ that corresponds to the second passive element L2. The passive element array 10 preferably includes, as illustrated in FIG. 3, two coil elements, for example.

In FIGS. 2A and 2B, illustration of inter-layer conductors (via conductors) included in the first passive element L1 or the second passive element L2 and lead-out conductors is omitted.

Furthermore, hereinafter, a direction in which the plurality of base material layers 12 are laminated will be referred to as a lamination direction Z, a direction that is perpendicular or substantially perpendicular to the lamination direction Z and in which the first passive element L1 and the second passive element L2 are arranged in line will be referred to as an X direction, and a direction that is perpendicular or substantially perpendicular to both of the lamination direction Z and the X direction will be referred to as a Y direction.

The element body 11 is preferably a rectangular or substantially rectangular parallelepiped and includes one main surface 11a that is perpendicular or substantially perpendicular to the axis of the lamination direction Z and the other main surface 11b that is opposite the one main surface 11a. The element body 11 is preferably, for example, a magnetic body such as magnetic ferrite ceramics. That is, each of the base material layers 12 is preferably a magnetic layer, for example. Specifically, as a material of the element body 11, ferrite including iron oxide as a main component and at least one or more of zinc, nickel, and copper, for example, is preferably used. Furthermore, as a material of the element body 11, a material having electrical characteristics (magnetic permeability, permittivity, and other characteristics) different from those of a substrate material of a printed wiring board is preferably used.

Preferably, the first passive element L1 is, for example, a coil element that includes a winding axis in the Z direction and has a rectangular or substantially rectangular outer shape when viewed from the winding axis direction and is a helical coil element structured by connecting coil patterns provided in the plurality of base material layers 12 with inter-layer conductors interposed therebetween. The first passive element L1, which is a coil element, includes a short side in the X direction and a long side in the Y direction. The coil axis of the first passive element L1 is parallel or substantially parallel to the axis of the lamination direction Z. Furthermore, the first passive element L1 is provided at a position closer to the one main surface 11a than the other main surface 11b of the element body 11.

Each of the first input/output terminals P11 and P12 is preferably, for example, a plane electrode terminal (that is, an LGA (Land Grid Array) electrode terminal) provided only in the one main surface 11a of the element body 11. The first input/output terminal P11 is connected to one end of the first passive element L1, and the first input/output terminal P12 is connected to the other end of the first passive element L1. The first input/output terminals P11 and P12 each have a rectangular or substantially rectangular shape and are disposed adjacent to each other in the Y direction. As illustrated in FIG. 2B, each of the first input/output terminals P11 and P12 is provided at a position overlapping the first passive element L1 when viewed from the lamination direction Z.

The second passive element L2 is arranged in a direction perpendicular or substantially perpendicular to the lamination direction Z, with respect to the first passive element L1. Specifically, the first passive element L1 and the second passive element L2 are adjacent to each other in the X direction.

The second passive element L2 is preferably, for example, a coil element that includes a winding axis in the Z direction and has a rectangular or substantially rectangular outer shape when viewed from the winding axis direction and is a helical coil element structured by connecting coil patterns provided in the plurality of base material layers 12 with inter-layer conductors interposed therebetween. The second passive element L2, which is a coil element, includes a short side in the X direction and a long side in the Y direction. The coil axis of the second passive element L2 is parallel or substantially parallel to the axis of the lamination direction Z. That is, the coil axis of the first passive element L1 and the coil axis of the second passive element L2 are parallel or substantially parallel to each other. In FIG. 1, the coil winding direction of the second passive element L2 is preferably the same or substantially the same as the coil winding direction of the first passive element L1.

Furthermore, the second passive element L2 is disposed at a position closer to the other main surface 11b than the one main surface 11a of the element body 11 and displaced with respect to the first passive element L1 by a specific distance in the lamination direction Z. Specifically, the first passive element L1 and the second passive element L2 are provided at different positions in the lamination direction Z (at different base material layers 12) and do not overlap when viewed from the X direction.

Each of second input/output terminals P21 and P22 is preferably, for example, a plane electrode terminal provided only in the other main surface 11b of the element body 11. The second input/output terminal P21 is connected to one end of the second passive element L2, and the second input/output terminal P22 is connected to the other end of the second passive element L2. The second input/output terminals P21 and P22 each have a rectangular or substantially rectangular shape and are adjacent to each other in the Y direction. As illustrated in FIG. 2B, each of the second input/output terminals P21 and P22 is d overlaps the second passive element L2 when viewed from the lamination direction Z.

The first ground terminal $P_{G1}$ is preferably, for example, a plane electrode terminal provided only in the other main surface 11b of the element body 11. The first ground terminal $P_{G1}$ is provided at a position overlapping the coil axis of the first passive element L1, and the pair of first input/output terminals P11 and P12, when viewed from the lamination direction Z. Furthermore, the first ground terminal $P_{G1}$ preferably has a rectangular or substantially rectangular shape and includes the first passive element L1 and the pair of first input/output terminals P11 and P12, when viewed from the lamination direction Z.

The second ground terminal $P_{G2}$ is preferably, for example, a plane electrode terminal provided only in the one main surface 11a of the element body 11. The second ground terminal $P_{G2}$ is provided at a position overlapping the coil axis of the second passive element L2, and the pair of second input/output terminals P21 and P22, when viewed from the lamination direction Z. Furthermore, the second ground terminal $P_{G2}$ preferably has a rectangular or substantially rectangular shape and includes the second passive element L2 and the pair of second input/output terminals P21 and P22, when viewed from the lamination direction Z.

As a material of the first passive element L1, the second passive element L2, the first input/output terminals P11 and P12, the second input/output terminals P21 and P22, the first ground terminal $P_{G1}$, and the second ground terminal $P_{G2}$, for example, metal or an alloy including silver as a main component is preferably used. Furthermore, for example, plating of nickel, palladium, or gold may be applied to the material of the first input/output terminals P11 and P12, the second input/output terminals P21 and P22, the first ground terminal $P_{G1}$, and the second ground terminal $P_{G2}$.

Next, non-limiting examples of manufacturing steps of the passive element array 10 will be described.

First, a plurality of green sheets, from which the base material layers 12 are to be made, are prepared. Specifically, magnetic green sheets are prepared by sheet-molding slurry including magnetic ceramic powder.

Next, a plurality of through-holes are formed in a specific green sheet. Then, conductive paste is filled in the plurality of through-holes to form a plurality of via conductors, and the conductive paste is applied to the green sheet with a specific pattern. Accordingly, a first coil pattern having a loop shape forming the first passive element L1 is formed. Furthermore, a plurality of through-holes are formed in a different green sheet. Then, conductive paste is filled in the plurality of through-holes to form a plurality of via conductors, and the conductive paste is applied to the green sheet with a specific pattern. Accordingly, a second coil pattern having a loop shape forming the second passive element L2 is formed. Through-holes are formed by, for example, laser machining.

Furthermore, via conductors are formed in a green sheet as one of outermost layers, and conductive paste is applied to the green sheet with specific patterns to form a pair of first input/output patterns and second ground patterns. Furthermore, via conductors are formed in a green sheet as the other one of the outermost layers, and a pair of second input/output patterns and first ground patterns are formed.

The coil patterns, input/output patterns, and ground patterns preferably are formed by screen-printing with conductive paste including, for example, Ag powder. The input/output patterns and the ground patterns may be formed by a thin film forming method, such as sputtering after firing, instead of a printing method.

Next, the plurality of green sheets in which the coil patterns, the input/output patterns, the ground patterns, and the like are formed are laminated and pressure-bonded, and then divided. After that, they are collectively fired. As a result of the firing, the magnetic ceramic powder in each of the green sheets is sintered, and the Ag powder in the conductive paste is sintered. By the above steps, the passive element array 10 is manufactured.

As described above, the passive element array 10 according to the present preferred embodiment is the passive element array 10 that is provided in a printed wiring board and includes the element body 11 that includes the plurality of laminated base material layers 12, the first passive element L1 and the second passive element L2 that are provided in the element body 11 and arranged in a direction perpendicular or substantially perpendicular to the lamination direction Z of the plurality of base material layers 12, the pair of first input/output terminals P11 and P12 that are provided at the one main surface 11a of the element body 11 and connected to the first passive element L1, and the pair of second input/output terminals P21 and P22 that are provided at the other main surface 11b of the element body 11 and connected to the second passive element L2.

With this configuration, the first input/output terminals P11 and P12 connected to the first passive element L1 and the second input/output terminals P21 and P22 connected to the second passive element L2 are provided at different main surfaces of the element body 11 with the element body 11 interposed therebetween. Therefore, isolation between the first input/output terminals P11 and P12 and the second input/output terminals P21 and P22 is able to be ensured.

In the present preferred embodiment, the first passive element L1 and the second passive element L2 do not overlap when viewed from the X direction. However, the arrangement of the first passive element L1 and the second passive element L2 is not limited to this. The first passive element L1 and the second passive element L2 may partially overlap each other.

Furthermore, in the present preferred embodiment, the first passive element L1 is close to the one main surface 11a side and the second passive element L2 is close to the other main surface 11b side. However, lead-out conductors connecting the passive elements and the input/output terminals may be extended in the lamination direction Z, so that the first passive element L1 may be close to the other main surface 11b side and the second passive element L2 may be close to the one main surface 11a side.

Furthermore, in the present preferred embodiment, the first passive element L1 is a coil element. However, the first passive element L1 is not limited to this. The first passive element L1 may include two coil elements that are arranged in line in the Y direction and connected in series. Furthermore, the second passive element L2 may include two coil elements that are arranged in line in the Y direction and connected in series.

Second Preferred Embodiment

A passive element array 10A according to a second preferred embodiment of the present invention includes a third passive element L3, a pair of third input/output terminals P31 and P32, and a third ground terminal $P_{G3}$, in addition to the configuration of the passive element array 10 according to the first preferred embodiment.

Figure 4:
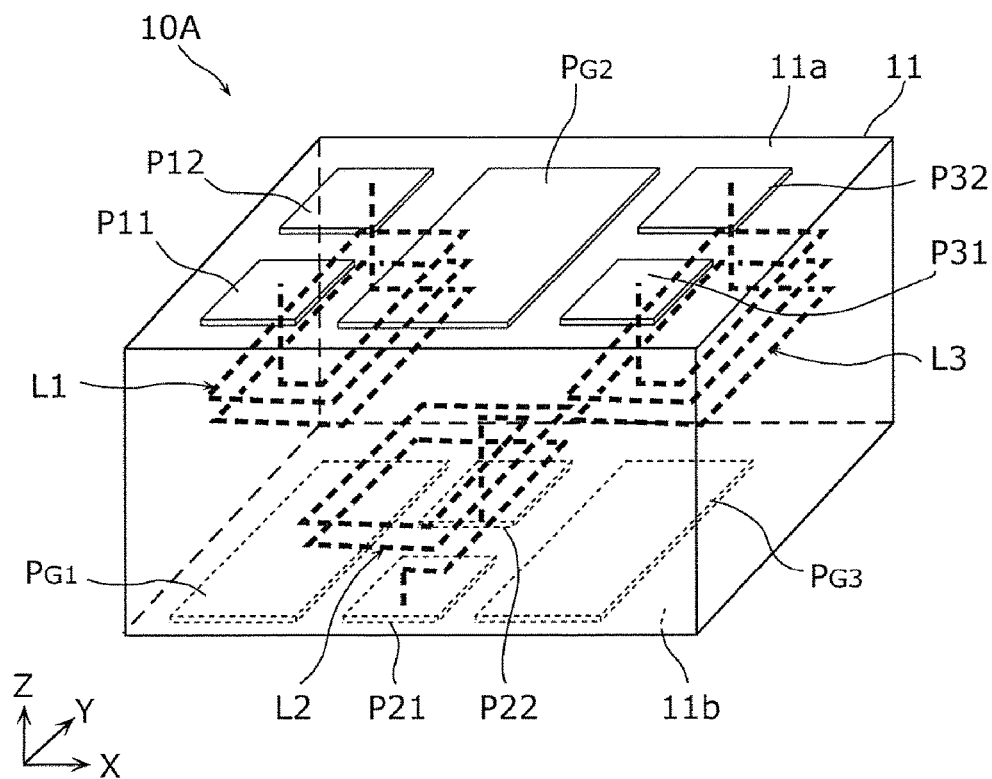
FIG. 4 is a schematic view of a passive element array according to a second preferred embodiment of the present invention.
Figure 5A:
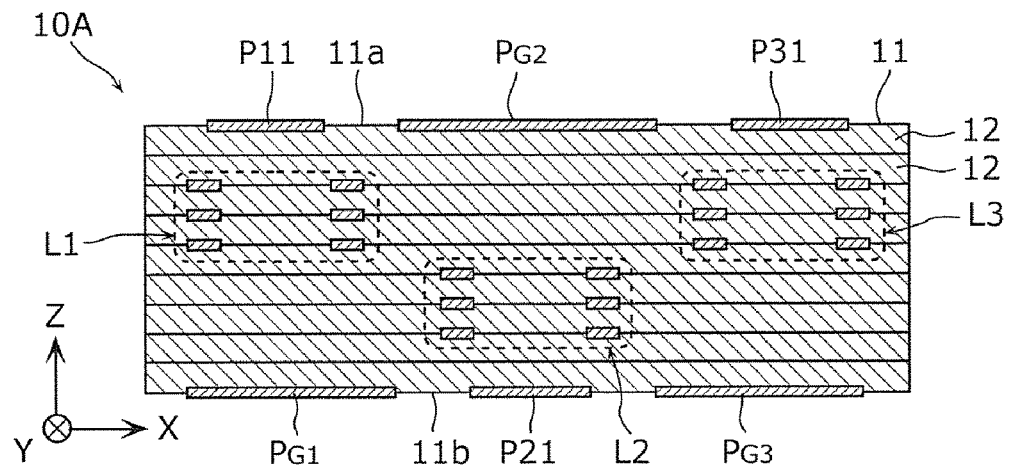
FIG. 5A is a cross-sectional schematic view of the passive element array according to the second preferred embodiment of the present invention when viewed from a Y direction.
Figure 5B:
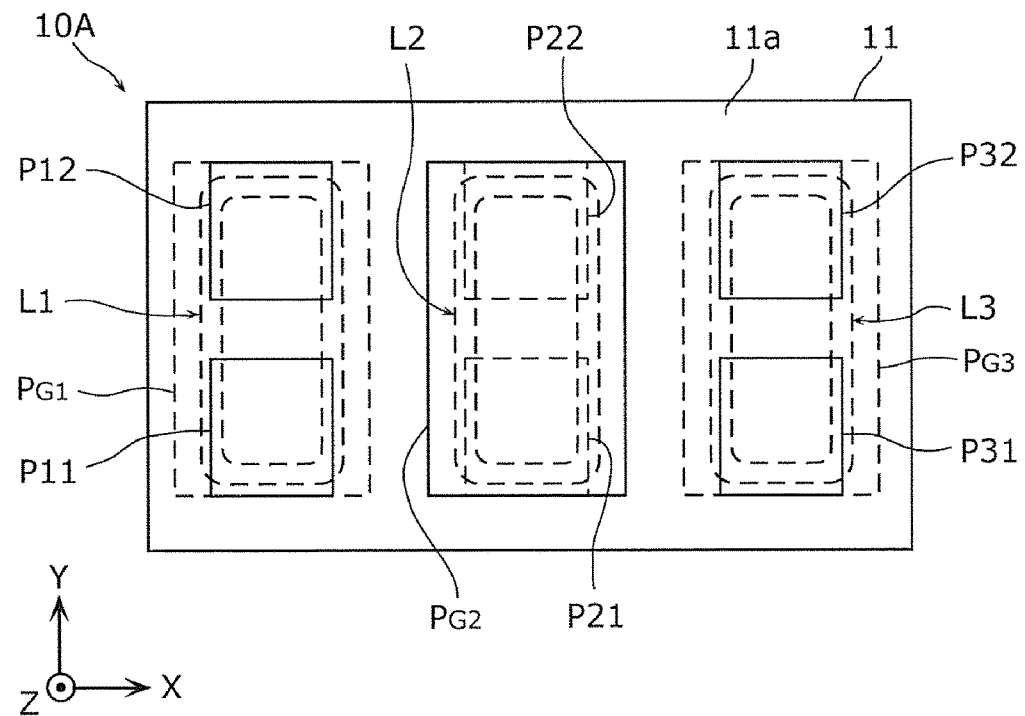
FIG. 5B is a diagram illustrating the passive element array according to the second preferred embodiment of the present invention when viewed from a lamination direction.
Figure 6:
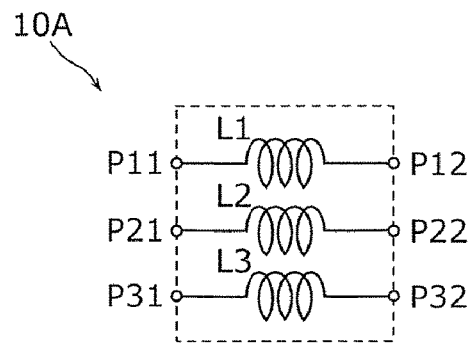
FIG. 6 is a diagram illustrating an equivalent circuit of the passive element array according to the second preferred embodiment of the present invention.

FIG. 4 is a schematic view of the passive element array 10A according to the second preferred embodiment. FIG. 5A is a cross-sectional schematic view of the passive element array 10A when viewed from the Y direction. FIG. 5B is a diagram illustrating the passive element array 10A when viewed from the lamination direction Z. FIG. 6 is a diagram illustrating an equivalent circuit of the passive element array 10A.

The passive element array 10A includes, as illustrated in FIGS. 4, 5A, and 5B, the element body 11 that includes the plurality of laminated base material layers 12, the first passive element L1, the second passive element L2, and the third passive element L3 that are provided in the element body 11, the pair of first input/output terminals P11 and P12 that are connected to the first passive element L1, the pair of second input/output terminals P21 and P22 that are connected to the second passive element L2, and the pair of third input/output terminals P31 and P32 that are connected to the third passive element L3. Furthermore, the passive element array 10A includes the first ground terminal $P_{G1}$ corresponding to the first passive element L1, the second ground terminal $P_{G2}$ corresponding to the second passive element L2, and the third ground terminal $P_{G3}$ corresponding to the third passive element L3. The passive element array 10A includes, as illustrated in FIG. 6, three coil elements.

In FIGS. 5A and 5B, illustration of inter-layer conductors (via conductors) included in the first passive element L1, the second passive element L2, and the third passive element L3 and lead conductors is omitted.

The element body 11 is preferably, for example, a rectangular or substantially rectangular parallelepiped and includes one main surface 11a that is perpendicular or substantially perpendicular to the axis of the lamination direction Z and the other main surface 11b that is opposite the one main surface.

The third passive element L3 is opposite the first passive element L1 relative to the second passive element L2, along the direction (X direction) in which the first passive element L1 and the second passive element L2 are provided. That is, the first passive element L1, the second passive element L2, and the third passive element L3 are arranged in order along the X direction.

The third passive element L3 is preferably, for example, a coil element having a rectangular or substantially rectangular outer shape. The third passive element L3 includes a short side in the X direction and a long side in the Y direction, and the coil axis of the third passive element L3 is parallel or substantially parallel to the axis of the lamination direction Z. That is, the coil axes of the first passive element L1, the second passive element L2, and the third passive element L3 are parallel or substantially parallel to one another. The coil winding direction of the third passive element L3 is the same or substantially the same as the coil winding direction of the first passive element L1.

Furthermore, the third passive element L3 is closer to the one main surface 11a than the other main surface 11b of the element body 11 and displaced with respect to the second passive element L2 by a specific distance in the lamination direction Z. Specifically, the third passive element L3 is provided at a position overlapping the first passive element L1 but not overlapping the second passive element L2 when viewed from the X direction.

Each of the third input/output terminals P31 and P32 is preferably, for example, a plane electrode terminal that is provided only in the one main surface 11a of the element body 11. The third input/output terminal P31 is connected to one end of the third passive element L3, and the third input/output terminal P32 is connected to the other end of the third passive element L3. The third input/output terminals P31 and P32 each have a rectangular or substantially rectangular shape and are adjacent to each other in the Y direction. As illustrated in FIG. 5B, each of the third input/output terminals P31 and P32 overlaps the third passive element L3 when viewed from the lamination direction Z.

The third ground terminal $P_{G3}$ is preferably, for example, a plane electrode terminal that is provided only in the other main surface 11b of the element body 11. The third ground terminal $P_{G3}$ overlaps the coil axis of the third passive element L3, and the pair of third input/output terminals P31 and P32 when viewed from the lamination direction Z. Furthermore, the third ground terminal $P_{G3}$ has a rectangular or substantially rectangular shape and includes the third passive element L3 and the pair of third input/output terminals P31 and P32 when viewed from the lamination direction Z.

The second ground terminal $P_{G2}$ is provided between the pair of first input/output terminals P11 and P12 and the pair of third input/output terminals P31 and P32. Specifically, the second ground terminal $P_{G2}$ extends in the Y direction over the range from a position between the first input/output terminal P11 and the third input/output terminal P31 to a position between the first input/output terminal P12 and the third input/output terminal P32.

That is, the passive element array 10A according to the present preferred embodiment includes the first passive element L1, the second passive element L2, and the third passive element L3 that are provided in the element body 11 and arranged sequentially in a direction perpendicular or substantially perpendicular to the lamination direction Z, the pair of first input/output terminals P11 and P12 that are provided at the one main surface 11a of the element body 11 and connected to the first passive element L1, the pair of second input/output terminals P21 and P22 that are provided at the other main surface 11b of the element body 11 and connected to the second passive element L2, the pair of third input/output terminals P31 and P32 that are provided at the one main surface 11a of the element body 11 and connected to the third passive element L3, and the ground terminal $P_{G2}$ that is provided at the one main surface 11a of the element body 11. The ground terminal $P_{G2}$ is provided between the pair of first input/output terminals P11 and P12 and the pair of third input/output terminals P31 and P32.

As described above, by providing the ground terminal $P_{G2}$ between the first input/output terminals P11 and P12 and the third input/output terminals P31 and P32, isolation between the first input/output terminals P11 and P12 and the third input/output terminals P31 and P32 is able to be ensured.

Furthermore, the first input/output terminals P11 and P12 and the second input/output terminals P21 and P22 are provided at different main surfaces of the element body 11 with the element body 11 interposed therebetween. Therefore, isolation between the first input/output terminals P11 and P12 and the second input/output terminals P21 and P22 is able to be ensured. Furthermore, the second input/output terminals P21 and P22 and the third input/output terminals P31 and P32 are provided at different main surfaces of the element body 11 with the element body 11 interposed therebetween. Therefore, isolation between the second input/output terminals P21 and P22 and the third input/output terminals P31 and P32 is able to be ensured.

Next, a case in which the passive element array 10A is provided in a printed wiring board will be explained.

Figure 7:
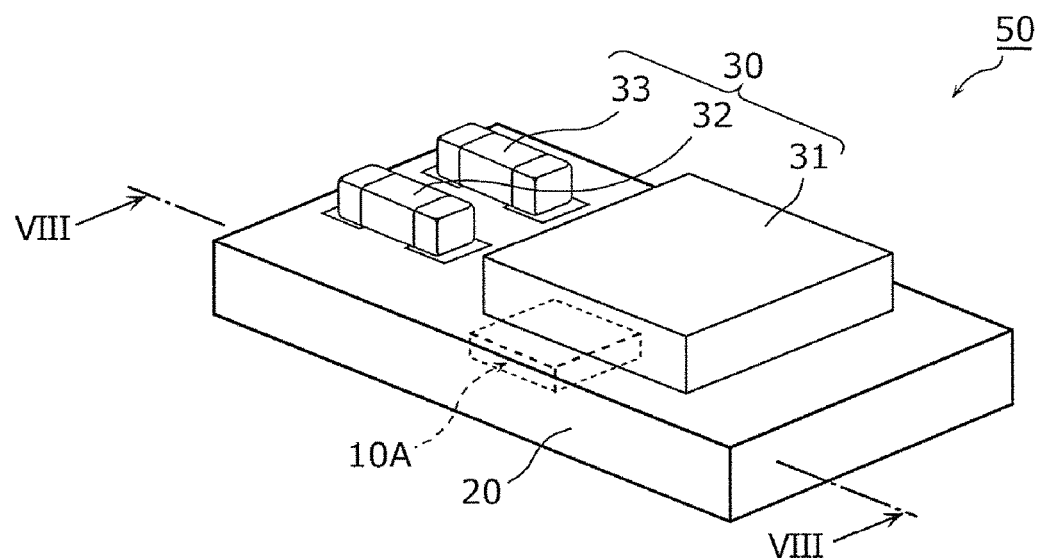
FIG. 7 is a perspective view of a printed wiring board in which the passive element array according to the second preferred embodiment of the present invention is built.
Figure 8:
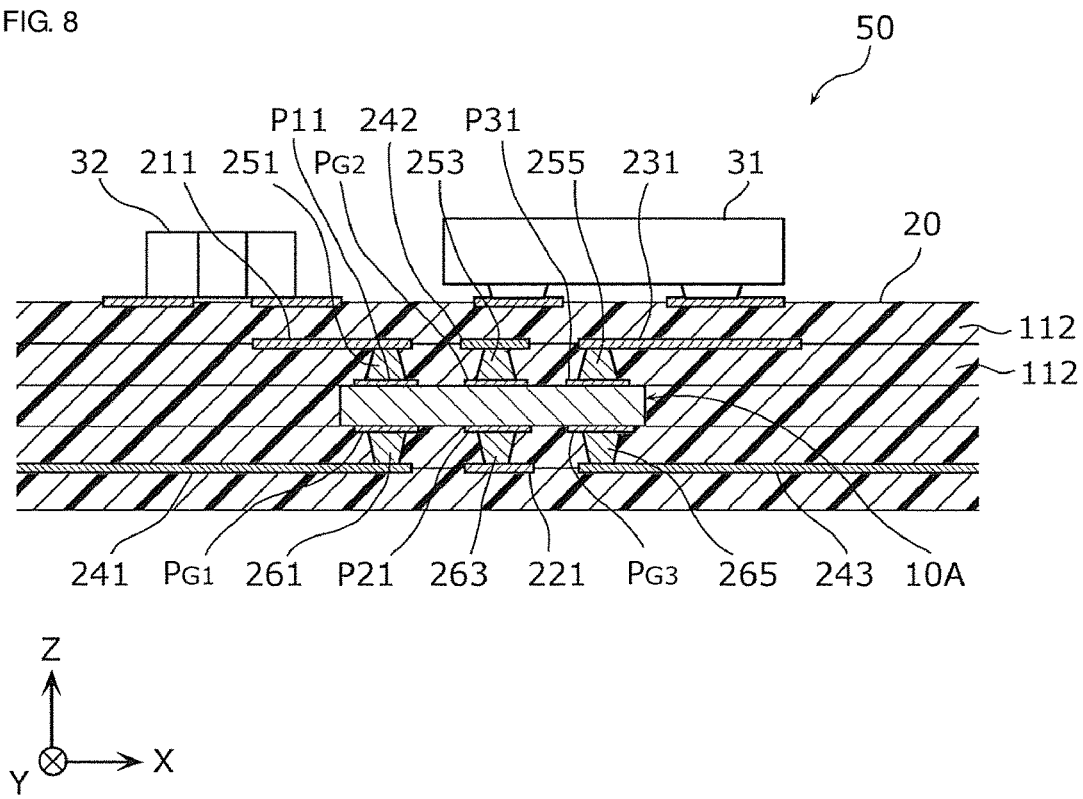
FIG. 8 is a schematic view of the printed wiring board according to the second preferred embodiment of the present invention taken along line VIII-VIII of FIG. 7.

FIG. 7 is a perspective view of a printed wiring board 20 in which the passive element array 10A is provided. FIG. 8 is a schematic view of the printed wiring board 20 taken along line VIII-VIII of FIG. 7.

The printed wiring board 20 according to the present preferred embodiment is used as, for example, a substrate of a high-frequency module 50. The high-frequency module 50 is preferably, for example, a DC-DC converter and includes, as illustrated in FIG. 7, the printed wiring board 20 in which the passive element array 10A is provided and mount components 30 (a switching IC 31, chip capacitors 32 and 33, etc.) mounted on the printed wiring board 20. The switching IC 31 performs switching of a voltage input to an input terminal and outputs the voltage through an output terminal. The chip capacitors 32 and 33 are smoothing capacitors on an input side and an output side. One of coil elements of the passive element array 10A is used as a choke coil.

The printed wiring board 20 is a circuit substrate on which various electronic components are mounted and includes wiring patterns connecting the electronic components. For example, the printed wiring board 20 is formed by laminating and pressure-bonding a plurality of resin base material layers 112. As a material of the resin base material layers 112, for example, a thermoplastic resin sheet made of liquid crystal polymer (LCP) or polyimide is preferably used. Various conductors, such as an in-plane conductor, an inter-layer conductor, and a surface conductor are provided at the printed wiring board 20. The entire passive element array 10A is embedded in the printed wiring board 20 and is connected to the mount components 30 with the various conductors described above interposed therebetween. The printed wiring board 20 is not limited to a multilayer body including the resin base material layers 112. The printed wiring board 20 may be a multilayer body including base materials made of a material with a lower magnetic permeability than a magnetic material.

Next, a connection structure of input/output terminals and ground terminals of the passive element array 10A in the printed wiring board 20 will be described.

Figure 9A:
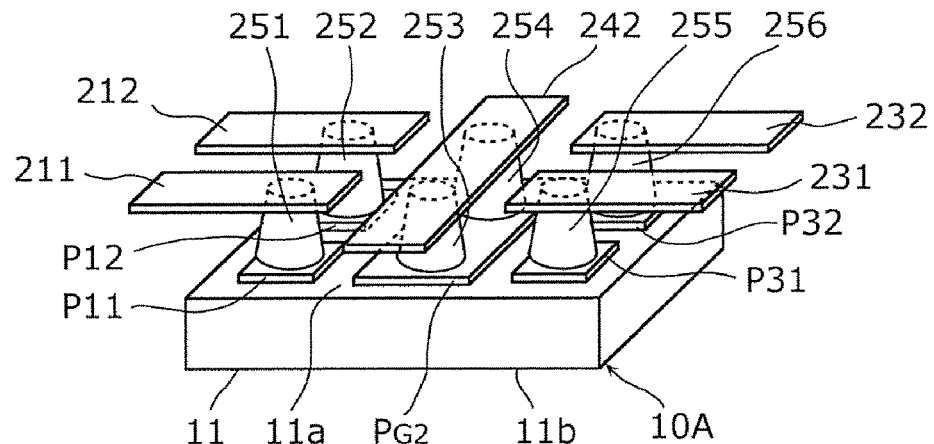
FIG. 9A is a diagram illustrating a connection form at one main surface of the passive element array built in the printed wiring board according to the second preferred embodiment of the present invention.
Figure 9A:
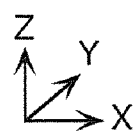
Figure 9B:
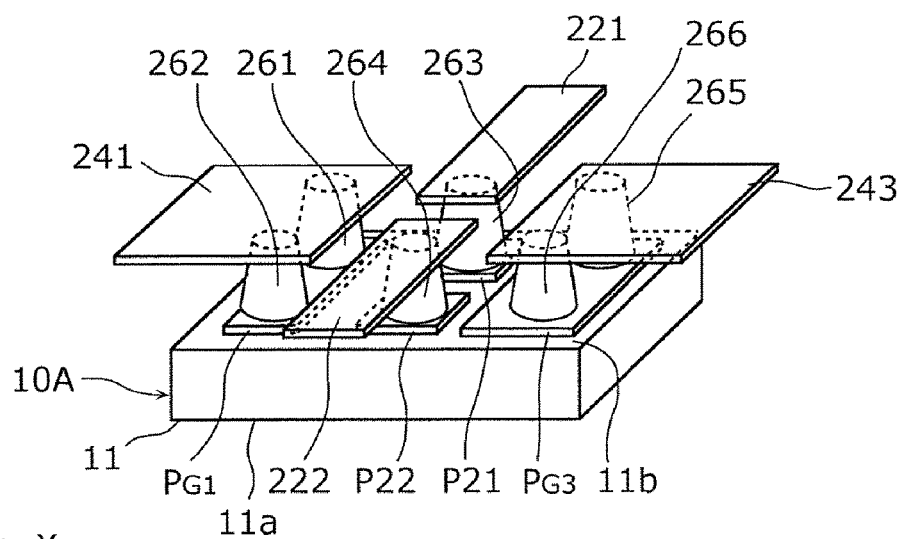
FIG. 9B is a diagram illustrating a connection form at the other main surface of the passive element array built in the printed wiring board according to the second preferred embodiment of the present invention.
Figure 9B:
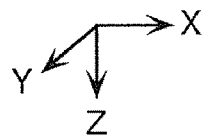

FIG. 9A is a diagram illustrating a connection structure at the one main surface 11a of the passive element array 10A provided in the printed wiring board 20. FIG. 9B is a diagram illustrating a connection structure at the other main surface 11b of the passive element array 10A provided in the printed wiring board 20.

As illustrated in FIG. 9A, on the one main surface 11a side of the passive element array 10A, the first input/output terminals P11 and P12 are connected to first signal lines 211 and 212 with inter-layer conductors 251 and 252 interposed therebetween, respectively. Each of the first signal lines 211 and 212 is led out along the X direction and connected to a specific mount component 30. The third input/output terminals P31 and P32 are connected to third signal lines 231 and 232 with inter-layer conductors 255 and 256 interposed therebetween, respectively. Each of the third signal lines 231 and 232 is led out along the X direction and connected to a specific mount component 30. Furthermore, the second ground terminal $P_{G2}$ is connected to a second ground line 242 with inter-layer conductors 253 and 254 interposed therebetween. The second ground line 242 is led out along the Y direction and connected to ground electrodes provided over the entire or substantially the entire printed wiring board 20.

In the present preferred embodiment, the passive element array 10A includes the second ground terminal $P_{G2}$ between the first input/output terminals P11 and P12 and the third input/output terminals P31 and P32. Therefore, in the case in which the passive element array 10A is built in the printed wiring board 20, a structure in which the second ground line 242 is disposed between the first signal lines 211 and 212 and the third signal lines 231 and 232 is obtained. With this structure, isolation between the first signal lines 211 and 212 and the third signal lines 231 and 232 in the printed wiring board 20 is able to be ensured.

As illustrated in FIG. 9B, on the other main surface 11b side of the passive element array 10A, the second input/output terminals P21 and P22 are connected to second signal lines 221 and 222 with inter-layer conductors 263 and 264 interposed therebetween, respectively. Each of the second signal lines 221 and 222 is led out along the Y direction. Furthermore, the first ground terminal $P_{G1}$ is connected to a first ground line 241 with inter-layer conductors 261 and 262 interposed therebetween. The first ground line 241 is led out along the X direction and is connected to the ground. Furthermore, the third ground terminal $P_{G3}$ is connected to a third ground line 243 with inter-layer conductor 265 and 266 interposed therebetween. The third ground line 243 is led out along the X direction and connected to ground electrodes provided over the entire or substantially the entire printed wiring board 20.

In the present preferred embodiment, the passive element array 10A includes the first ground terminal $P_{G1}$ on the negative X direction side of the second input/output terminals P21 and P22 and includes the third ground terminal $P_{G3}$ on the positive X direction side of the second input/output terminals P21 and P22. Therefore, in the case in which the passive element array 10A is provided in the printed wiring board 20, a structure in which the second signal lines 221 and 222 near the passive element array 10A are sandwiched between the first ground line 241 and the third ground line 243 is obtained. With this structure, interference between signals in the second signal lines 221 and 222 and a signal in another signal line in the printed wiring board 20 is able to be reduced or prevented.

Furthermore, in the present preferred embodiment, the second ground terminal $P_{G2}$ preferably having, for example, a rectangular or substantially rectangular shape is provided between the first input/output terminals P11 and P12 and the third input/output terminals P31 and P32. However, the shape of the second ground terminal $P_{G2}$ is not limited to this. For example, a mesh may be provided in a portion of the second ground terminal $P_{G2}$. Furthermore, a slit along the Y direction or other suitable structure may be provided in the second ground terminal $P_{G2}$.

Furthermore, the second ground terminal $P_{G2}$ preferably extends entirely or substantially entirely between the first input/output terminals P11 and P12 and the third input/output terminals P31 and P32. However, the second ground terminal $P_{G2}$ is not necessarily provided as described above. The second ground terminal $P_{G2}$ may partially extend between the first input/output terminals P11 and P12 and the third input/output terminals P31 and P32. That is, the second ground terminal $P_{G2}$ may overlap with a portion of the first input/output terminals P11 and P12 and a portion of the third input/output terminals P31 and P32 when viewed from the X direction.

Third Preferred Embodiment

A passive element array 10B according to a third preferred embodiment of the present invention includes three capacitors corresponding to the three coil elements illustrated in the second preferred embodiment.

Figure 10:
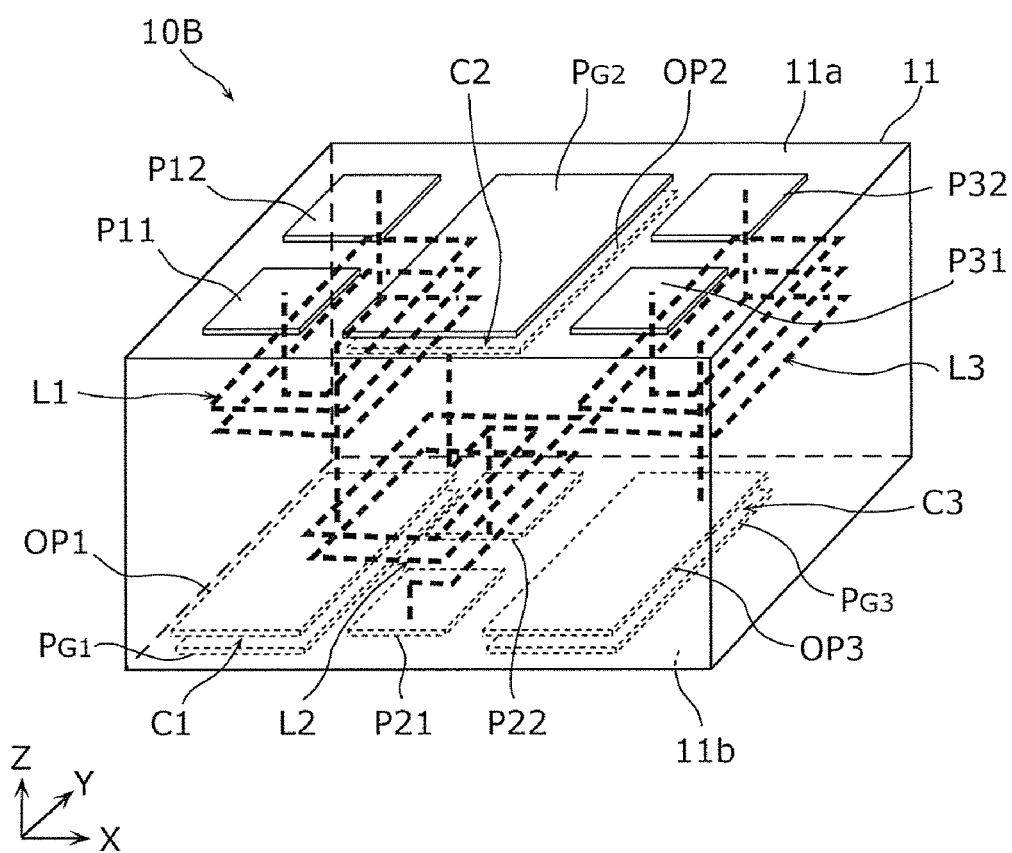
FIG. 10 is a schematic view of a passive element array according to a third preferred embodiment of the present invention.
Figure 11:
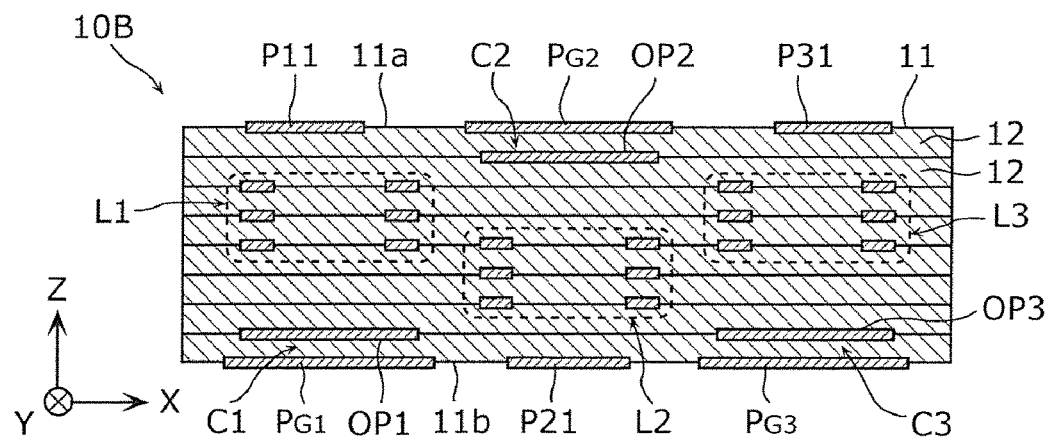
FIG. 11 is a cross-sectional schematic view of the passive element array according to the third preferred embodiment of the present invention when viewed from a Y direction.
Figure 12:
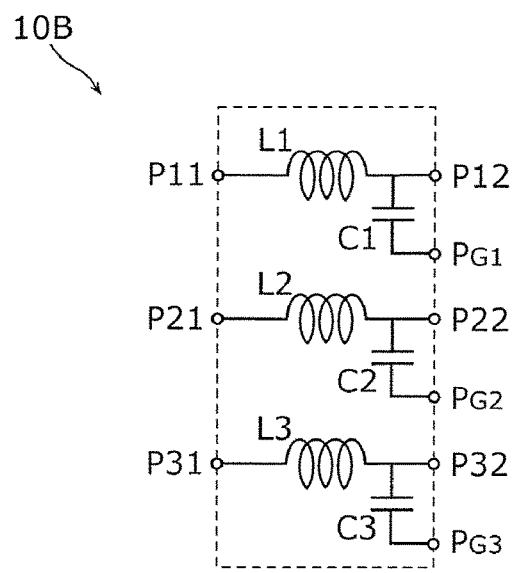
FIG. 12 is a diagram illustrating an equivalent circuit of the passive element array according to the third preferred embodiment of the present invention.

FIG. 10 is a schematic view of the passive element array 10B according to the third preferred embodiment. FIG. 11 is a cross-sectional schematic view of the passive element array 10B when viewed from the Y direction. FIG. 12 is a diagram illustrating an equivalent circuit of the passive element array 10B.

The passive element array 10B according to the third preferred embodiment includes a first facing electrode OP1, a second facing electrode OP2, and a third facing electrode OP3 in the element body 11.

The first facing electrode OP1 is preferably, for example, a flat internal electrode and faces the first ground terminal $P_{G1}$. The first facing electrode OP1 and the first ground terminal $P_{G1}$ face each other to define a first capacitor C1. The first facing electrode OP1 is connected to one end or the other end of the first passive element L1. In the present preferred embodiment, the first facing electrode OP1 is connected between the first passive element L1 and the first input/output terminal P12.

The second facing electrode OP2 is preferably, for example, a flat internal electrode and faces the second ground terminal $P_{G2}$. The second facing electrode OP2 and the second ground terminal $P_{G2}$ face each other to define a second capacitor C2. The second facing electrode OP2 is connected to one end or the other end of the second passive element L2. In the present preferred embodiment, the second facing electrode OP2 is connected between the second passive element L2 and the second input/output terminal P22.

The third facing electrode OP3 is preferably, for example, a flat internal electrode and faces the third ground terminal $P_{G3}$. The third facing electrode OP3 and the third ground terminal $P_{G3}$ face each other to define a third capacitor C3. The third facing electrode OP3 is connected to one end or the other end of the third passive element L3. In the present preferred embodiment, the third facing electrode OP3 is connected between the third passive element L3 and the third input/output terminal P32.

Accordingly, as illustrated in FIG. 12, the passive element array 10B includes three LC filters (low pass filters).

In the present preferred embodiment, in the case in which the first passive element L1, the second passive element L2, and the third passive element L3 are viewed from the X direction, the second passive element L2 is overlaps a portion of the first passive element L1 and a portion of the third passive element L3.

Layers between the first facing electrode OP1 and the first ground terminal $P_{G1}$, between the second facing electrode OP2 and the second ground terminal $P_{G2}$, and between the third facing electrode OP3 and the third ground terminal $P_{G3}$ may be made of a dielectric material. In this case, capacitances of the first capacitor C1, the second capacitor C2, and the third capacitor C3 may be increased.

Fourth Preferred Embodiment

Figure 13A:
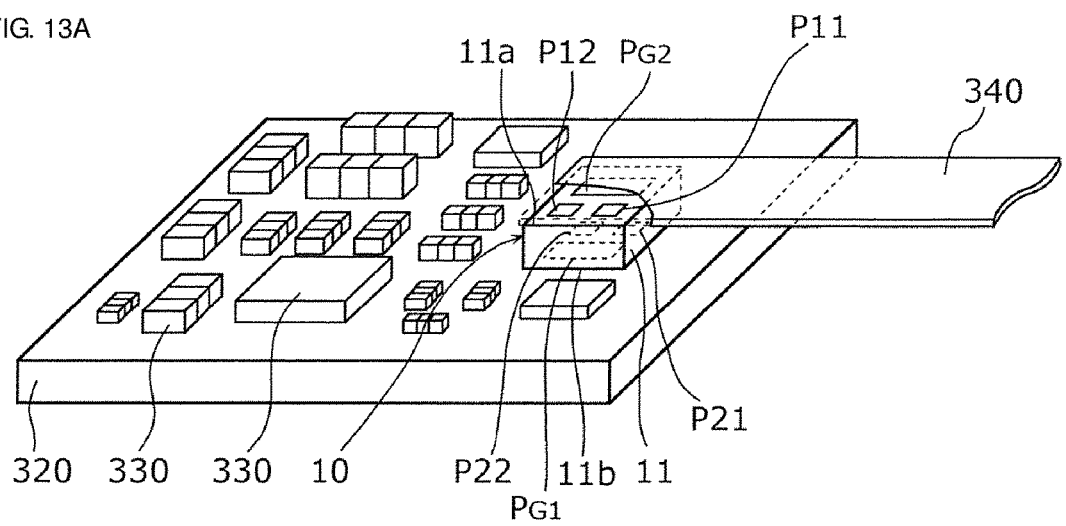
FIG. 13A is a perspective view of a printed wiring board in which the passive element array according to the first preferred embodiment of the present invention is mounted.

In a fourth preferred embodiment of the present invention, a printed wiring board 320 in which the passive element array 10 according to the first preferred embodiment is provided will be explained. FIG. 13A is a perspective view of the printed wiring board 320 in which the passive element array 10 is mounted. In FIG. 13A, a state in which a portion of a flexible cable 340 is cut out is illustrated.

The printed wiring board 320 in the present preferred embodiment is preferably a motherboard in an electronic apparatus, for example. As illustrated n FIG. 13A, the passive element array 10 and a plurality of surface mount components 330 (for example, a switching IC, a chip capacitor, etc.) are mounted on the printed wiring board 320.

The flexible cable 340 is connected to the passive element array 10 mounted on the printed wiring board 320. Specifically, each of the first input/output terminals P11 and P12 and the second ground terminal $P_{G2}$ on the one main surface 11a side of the passive element array 10 is connected to the flexible cable 340 by soldering or other suitable method. Furthermore, each of the second input/output terminals P21 and P22 and the first ground terminal $P_{G1}$ on the other main surface 11b side of the passive element array 10 is connected to the printed wiring board 320 by soldering or other suitable method. That is, the flexible cable 340 and the printed wiring board 320 are connected with the element body 11 of the passive element array 10 interposed therebetween, and the passive element array 10 defines and functions as an interposer for the flexible cable 340 and the printed wiring board 320.

The passive element array 10 illustrated in the first preferred embodiment is mounted on the printed wiring board 320 according to the present preferred embodiment. The second input/output terminals P21 and P22 of the passive element array 10 are connected to the printed wiring board 320. Furthermore, the first input/output terminals P11 and P12 of the passive element array 10 are connected to the flexible cable 340.

With the printed wiring board 320, the flexible cable 340 connected to the first input/output terminals P11 and P12 and the printed wiring board 320 connected to the second input/output terminals P21 and P22 are arranged with the element body 11 of the passive element array 10 interposed therebetween. Therefore, isolation between the flexible cable 340 and the printed wiring board 320 is able to be ensured.

Figure 13B:
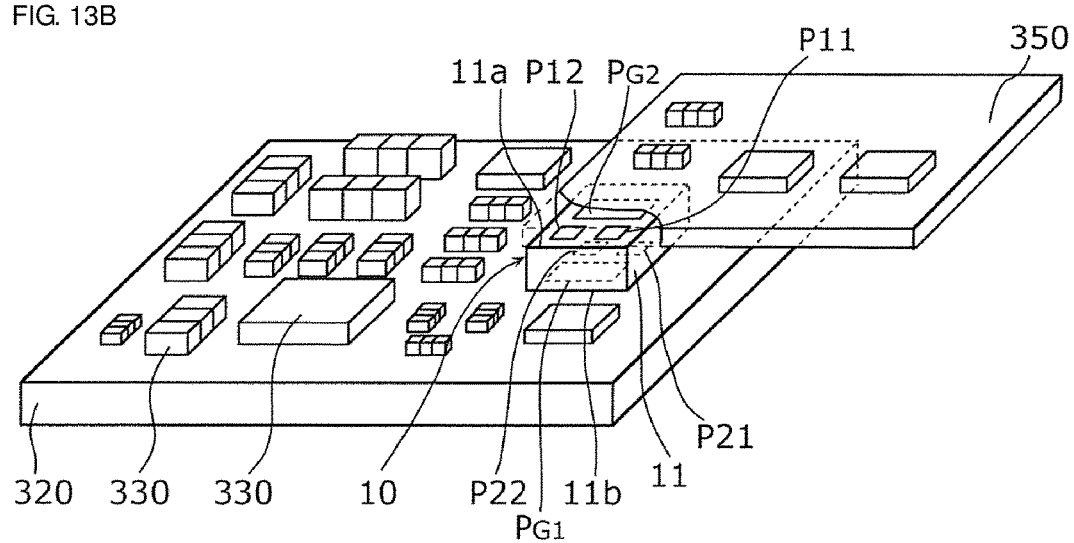
FIG. 13B is a perspective view illustrating another example of a printed wiring board in which the passive element array according to the first preferred embodiment of the present invention is mounted.

In FIG. 13A, an example in which the flexible cable 340 is connected to the passive element array 10 is illustrated. However, the present invention is not limited to this configuration. For example, as illustrated in FIG. 13B, a flexible wiring board 350 may be connected to the passive element array 10. That is, a structure in which the passive element array 10 illustrated in the first preferred embodiment is mounted on the printed wiring board 320 and the first input/output terminals P11 and P12 of the passive element array 10 are connected to the flexible wiring board 350, is also possible.

Furthermore, in the fourth preferred embodiment, the passive element array 10 illustrated in the first preferred embodiment is described as an example of a passive element array. However, the passive element array is not limited to the passive element array 10. The passive element array 10A according to the second preferred embodiment or the passive element array 10B according to the third preferred embodiment may be mounted on the printed wiring board 320.

That is, a structure in which the passive element array 10A according to the second preferred embodiment is mounted on the printed wiring board 320, each of the second input/output terminals P21 and P22, the first ground terminal $P_{G1}$, and the third ground terminal $P_{G3}$ of the passive element array 10A is connected to the printed wiring board 320, and each of the first input/output terminals P11 and P12, the third input/output terminals P31 and P32, and the second ground terminal $P_{G2}$ of the passive element array 10A is connected to the flexible cable 340 or the flexible wiring board 350, may be provided.

Furthermore, a structure in which the passive element array 10B according to the third preferred embodiment is mounted on the printed wiring board 320, each of the second input/output terminals P21 and P22, the first ground terminal $P_{G1}$, and the third ground terminal $P_{G3}$ of the passive element array 10B is connected to the printed wiring board 320, and each of the first input/output terminals P11 and P12, the third input/output terminals P31 and P32, and the second ground terminal $P_{G2}$ of the passive element array 10B is connected to the flexible cable 340 or the flexible wiring board 350, may be provided.

The passive element arrays and the printed wiring boards 20 and 320 according to the first, second, third, and fourth preferred embodiments of the present invention are described above. However, the present invention is not limited to each of the first, second, third, and fourth preferred embodiments. Various modifications conceived by those skilled in the art made to the first, second, third, and fourth preferred embodiments and configurations obtained by combining components in different preferred embodiments may also be included in one or a plurality of preferred embodiments of the present invention as long as not departing from the scope of the present invention.

For example, a passive element array may include four or more passive elements.

That is, a passive element array may have a structure in which a plurality of passive element units each including a set of a passive element, a pair of input/output terminals, and a ground terminal are sequentially provided, a pair of input/output terminals of a passive element unit at an odd-numbered position and a ground terminal of a passive element unit at an even-numbered position are provided in order at the one main surface 11a of the element body 11, and a ground terminal of a passive element unit at an odd-numbered position and a pair of input/output terminals of a passive element unit at an even-numbered position are provided in order at the other main surface 11b of the element body 11. Accordingly, a ground terminal at an even-numbered position is provided between input/output terminals at odd-numbered positions. Thus, isolation between the input/output terminals at odd-numbered positions is able to be ensured. Furthermore, a ground terminal at an odd-numbered position is provided between input/output terminals at even-numbered positions. Thus, isolation between the input/output terminals at even-numbered positions are able to be ensured.

Furthermore, in the first, second, third, and fourth preferred embodiments, inductors are described as an example of passive elements. However, the passive elements are not necessarily inductors. The passive elements may be capacitors including a plurality of facing electrodes. In this case, the first input/output terminals P11 and P12 may be connected to one end and the other end of the first passive element L1, which is a capacitor, the second input/output terminals P21 and P22 may be connected to one end and the other end of the second passive element L2, which is a capacitor, and the third input/output terminals P31 and P32 may be connected to one end and the other end of the third passive element L3, which is a capacitor.

Passive element arrays according to preferred embodiments of the present invention may be, for example, provided in a printed wiring board. Furthermore, printed wiring boards according to preferred embodiments of the present invention may be widely used as substrates for high-frequency modules, such as DC-DC converters.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A passive element array provided in a printed wiring board, the passive element array comprising:
   an element body including a plurality of laminated base material layers;
   a first passive element and a second passive element provided in the element body and arranged in a direction perpendicular or substantially perpendicular to a lamination direction of the plurality of base material layers;
   a pair of first input/output terminals provided at one main surface of the element body and connected to the first passive element; and
   a pair of second input/output terminals provided at another main surface of the element body and connected to the second passive element; wherein
   a terminal connected to the second passive element is not provided at the one main surface of the element body, and a terminal connected to the first passive element is not provided at the another main surface of the element body.

2. The passive element array according to claim 1, further comprising:
   a third passive element provided in the element body and arranged in a direction perpendicular or substantially perpendicular to the lamination direction, with respect to the first passive element;
   a pair of third input/output terminals provided at the one main surface of the element body and connected to the third passive element; and
   a ground terminal provided at the one main surface of the element body; wherein
   the ground terminal is provided between the pair of first input/output terminals and the pair of third input/output terminals.

3. The passive element array according to claim 2, wherein the third passive element is opposite the first passive element relative to the second passive element, along a direction in which the first passive element and the second passive element are arranged.

4. The passive element array according to claim 2, wherein when the element body is viewed from the lamination direction, the pair of first input/output terminals overlaps the first passive element, the pair of second input/output terminals overlaps the second passive element, the pair of third input/output terminals overlaps the third passive element, and the ground terminal overlaps the second passive element.

5. The passive element array according to claim 4, wherein
   the ground terminal is a second ground terminal;
   the passive element array further includes:
      a first ground terminal and a third ground terminal that are provided at the other main surface of the element body; and when the element body is viewed from the lamination direction, the first ground terminal overlaps the first passive element, and the third ground terminal overlaps the third passive element.

6. The passive element array according to claim 2, wherein each of the first passive element, the second passive element, and the third passive element is an inductor.

7. The passive element array according to claim 6, further comprising:
   a first facing electrode facing the first ground terminal, a second facing electrode facing the second ground terminal, and a third facing electrode facing the third ground terminal, the first facing electrode, the second facing electrode, and the third facing electrode being arranged in the element body; wherein
   the first facing electrode is connected to one end or another end of the first passive element;
   the second facing electrode is connected to one end or another end of the second passive element; and
   the third facing electrode is connected to one end or another end of the third passive element.

8. The passive element array according to claim 1, wherein the first passive element and the second passive element are provided at different positions in the lamination direction.

9. The passive element array according to claim 1, wherein the first passive element is provided at a position closer to the one main surface than the another main surface, and the second passive element is provided at a position closer to the another main surface than the one main surface.

10. A passive element array mounted in a printed wiring board, the passive element array comprising:
    an element body including a plurality of laminated base material layers;
    a first passive element and a second passive element provided in the element body and arranged in a direction perpendicular or substantially perpendicular to a lamination direction of the plurality of base material layers;
    a pair of first input/output terminals provided at one main surface of the element body and connected to the first passive element; and
    a pair of second input/output terminals provided at another main surface of the element body and connected to the second passive element; wherein
    the first input/output terminals are connected to a flexible wiring board or a flexible cable, and the second input/output terminals are connected to the printed wiring board.

11. A printed wiring board comprising:
    a passive element array provided in the printed wiring board; wherein
    the passive element array includes:
       an element body including a plurality of laminated base material layers;
       a first passive element and a second passive element provided in the element body and arranged in a direction perpendicular or substantially perpendicular to a lamination direction of the plurality of base material layers;
       a pair of first input/output terminals provided at one main surface of the element body and connected to the first passive element; and
       a pair of second input/output terminals provided at another main surface of the element body and connected to the second passive element; and a terminal connected to the second passive element is not provided at the one main surface of the element body, and a terminal connected to the first passive element is not provided at the another main surface of the element body.

12. The printed wiring board according to claim 11, further comprising:
a third passive element provided in the element body and arranged in a direction perpendicular or substantially perpendicular to the lamination direction, with respect to the first passive element;
a pair of third input/output terminals provided at the one main surface of the element body and connected to the third passive element; and
a ground terminal provided at the one main surface of the element body; wherein
the ground terminal is provided between the pair of first input/output terminals and the pair of third input/output terminals.

13. The printed wiring board according to claim 12, wherein the third passive element is opposite the first passive element relative to the second passive element, along a direction in which the first passive element and the second passive element are arranged.

14. The printed wiring board according to claim 12, wherein when the element body is viewed from the lamination direction, the pair of first input/output terminals overlaps the first passive element, the pair of second input/output terminals overlaps the second passive element, the pair of third input/output terminals overlaps the third passive element.

15. The printed wiring board according to claim 14, wherein the ground terminal is a second ground terminal;
the passive element array further includes:
a first ground terminal and a third ground terminal that are provided at the other main surface of the element body; and
when the element body is viewed from the lamination direction, the first ground terminal overlaps the first passive element, and the third ground terminal overlaps the third passive element.

16. The printed wiring board according to claim 12, wherein each of the first passive element, the second passive element, and the third passive element is an inductor.

17. The printed wiring board according to claim 16, further comprising:
a first facing electrode facing the first ground terminal, a second facing electrode facing the second ground terminal, and a third facing electrode facing the third ground terminal, the first facing electrode, the second facing electrode, and the third facing electrode being arranged in the element body; wherein
the first facing electrode is connected to one end or another end of the first passive element;
the second facing electrode is connected to one end or another end of the second passive element; and
the third facing electrode is connected to one end or another end of the third passive element.

18. The printed wiring board according to claim 11, wherein the first passive element and the second passive element are provided at different positions in the lamination direction.

19. The printed wiring board according to claim 11, wherein the first passive element is provided at a position closer to the one main surface than the another main surface, and the second passive element is provided at a position closer to the another main surface than the one main surface.

20. A printed wiring board comprising
a passive element array mounted on the printed wiring board; wherein
the passive element array includes:
an element body including a plurality of laminated base material layers;
a first passive element and a second passive element provided in the element body and arranged in a direction perpendicular or substantially perpendicular to a lamination direction of the plurality of base material layers;
a pair of first input/output terminals provided at one main surface of the element body and connected to the first passive element; and
a pair of second input/output terminals provided at the other main surface of the element body and connected to the second passive element; wherein
the first input/output terminals are connected to a flexible wiring board or a flexible cable, and the second input/output terminals are connected to the printed wiring board.

* * * * *